(12) United States Patent
Xu et al.

(10) Patent No.: US 11,237,485 B2
(45) Date of Patent: Feb. 1, 2022

(54) SYSTEM, SOFTWARE APPLICATION, AND METHOD FOR LITHOGRAPHY STITCHING

(71) Applicant: Applied Materials, Inc., Santa Clara, CA (US)

(72) Inventors: Yongan Xu, Santa Clara, CA (US); Christopher Dennis Bencher, Cupertino, CA (US); Robert Jan Visser, Menlo Park, CA (US); Ludovic Godet, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 22 days.

(21) Appl. No.: 16/748,202

(22) Filed: Jan. 21, 2020

(65) Prior Publication Data

US 2021/0223704 A1    Jul. 22, 2021

(51) Int. Cl.
   G03F 7/20    (2006.01)
   G03F 7/00    (2006.01)

(52) U.S. Cl.
   CPC ...... *G03F 7/70475* (2013.01); *G03F 7/70616* (2013.01); *G03F 7/0012* (2013.01)

(58) Field of Classification Search
   CPC .............................. G03F 7/70475; G03F 1/70
   See application file for complete search history.

(56) References Cited

U.S. PATENT DOCUMENTS

| | | | |
|---|---|---|---|
| 5,652,163 A | | 7/1997 | Schinella et al. |
| 5,792,591 A | * | 8/1998 | Theuwissen ............ G03F 1/00 430/312 |
| 6,090,528 A | | 7/2000 | Gordon et al. |
| 6,962,762 B2 | | 11/2005 | Martin et al. |
| 9,087,740 B2 | | 7/2015 | Ausschnitt et al. |
| 2004/0191643 A1 | * | 9/2004 | Chang ..................... G03B 27/42 430/5 |
| 2009/0298205 A1 | * | 12/2009 | Nagahara ............ G03F 7/70475 438/14 |
| 2013/0182940 A1 | | 7/2013 | Hsu et al. |
| 2014/0035161 A1 | | 2/2014 | Yuan et al. |
| 2015/0192823 A1 | | 7/2015 | Fu |
| 2019/0164899 A1 | | 5/2019 | Hu et al. |

FOREIGN PATENT DOCUMENTS

KR    10-2002-0002173 A    1/2002

OTHER PUBLICATIONS

International Search Report/Written Opinion issued to PCT/US2020/064569 dated Mar. 30, 2021.

* cited by examiner

*Primary Examiner* — Steven Whitesell Gordon
(74) *Attorney, Agent, or Firm* — Patterson + Sheridan, LLP (57) ABSTRACT

Embodiments of the present disclosure relate to methods for positioning masks in a propagation direction of a light source. The masks correspond to a pattern to be written into a photoresist layer of a substrate. The masks are positioned by stitching a first mask and a second mask. The first mask includes a set of first features having first feature extensions extending therefrom at first feature interfaces. The second mask includes a set of second features having second feature extensions extending therefrom at second feature interfaces. Each first feature extension stitches with each corresponding second feature extension to form each stitched portion of a first stitched portion of the first pair of masks. The stitched portion of the first pair of masks defines a portion of the pattern to be written into the photoresist layer.

18 Claims, 9 Drawing Sheets

SYSTEM, SOFTWARE APPLICATION, AND METHOD FOR LITHOGRAPHY STITCHING

BACKGROUND

Field

Embodiments of the present disclosure generally relate to photolithography systems. More specifically, embodiments of the present disclosure relates to a system, software application, and method for stitching of the interface between masks.

Description of the Related Art

Photolithography is widely used in the manufacturing of semiconductor devices, such as for back-end processing of semiconductor devices, and display devices, such for liquid crystal displays (LCDs). For example, large area substrates are often used in the manufacture of display devices, such as optic chips used in augmented reality or virtual reality (AR/VR) devices. A photolithography system has a projection unit that projects write beams in the direction of one or more masks. The one or more masks have a pattern that corresponds to a pattern to be written into the photoresist layer on the surface of the substrate. However, a single mask pattern transferred by the photolithography system, may not cover the entire area of the substrate. Moreover, while multiple mask patterns can be transferred adjacent to one another in order to cover the large area, the stitching area at the interface between the masks can form gaps in the pattern to be written into the photoresist layer. Gaps in the pattern to be written into the photoresist form pattern defects resulting in reduced quality of the display devices. Accordingly, there is a need in the art for improved methods for lithography stitching of masks.

SUMMARY

In one embodiment, a method is provided. The method includes positioning two or more masks in a propagation direction of a light source, the masks corresponding to a pattern to be written into a photoresist layer of a substrate disposed under the masks. Positioning the masks includes stitching a pair of masks. The first mask in the pair includes a set of first features having first feature extensions extending therefrom at first feature interfaces and the second mask includes a set of second features having second feature extensions extending therefrom at second feature interfaces. Each first feature extension stitches with each corresponding second feature extension to form each stitched portion of a first stitched portion of the first pair of masks, the stitched portion of the first pair of masks defining a portion of the pattern to be written into the photoresist layer.

In another embodiment, a non-transitory computer readable medium is provided. The non-transitory computer readable medium includes a set of instructions that when executed by a processor, cause a computer system to create a design file having to a pattern to be written into a photoresist layer. The computer system then divides the design file between two or more mask patterns and generates a plurality of features for each of the mask patterns. The features of each of the mask patterns include first feature extensions that are to be stitched with second feature extensions of adjacent mask patterns, and the first feature extensions to be stitched with the second feature extensions define portions of the pattern to be written into the photoresist layer at the interfacing of two or more masks formed from the two or more mask patterns.

In another embodiment, a non-transitory computer readable medium is provided. The non-transitory computer readable medium includes a set of instructions that when executed by a processor, cause a computer system to divide a design file between two or more mask patterns. The computer system then generates a model of stitched portions of the two or more mask patterns using one or more of $\theta1=f(L1, \lambda1, \Delta)$, $\Delta=f(L1, \lambda1, \theta1)$, $\theta2=f(L2, \lambda2, \Delta)$, and $\Delta=f(L2, \lambda2, \theta2)$. The stitched portions including first features having first feature extensions extending therefrom at first feature interfaces and corresponding second features having second feature extensions extending therefrom at second feature interfaces. A first feature end location ($\theta1$) is a distance from each second feature interface to an opposing end of each corresponding first feature extension in each stitched portion. A stitching shift ($\Delta$) is half a distance from each first feature interface to each corresponding second feature interface of each stitched portion. A first feature width ($L1$) is a first feature width at each of the first feature interfaces of each stitched portion. A first feature extension length ($\lambda1$) is a length of each first feature extension. A second feature end location ($\theta2$) is a distance from each first feature interface to an opposing end of each corresponding second feature extension in each stitched portion. A second feature width ($L2$) is a second feature width at each of the second feature interfaces of each stitched portion. A second feature extension length ($\lambda2$) is a length of each second feature extension.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present disclosure relate to a system, software application, and method for lithography stitching.

Some embodiments of the method includes positioning two or more masks in a propagation direction of a light source. The masks correspond to a pattern to be written into a photoresist layer of a substrate disposed under the masks. Positioning the masks includes stitching a pair of masks. The first mask in the pair includes a set of first features having first feature extensions extending therefrom at first feature interfaces and the second mask includes a set of second features having second feature extensions extending therefrom at second feature interfaces. Each first feature extension stitches with each corresponding second feature extension to form each stitched portion of a first stitched portion of the first pair of masks, the stitched portion of the first pair of masks defining a portion of the pattern to be written into the photoresist layer.

Figure 1A:
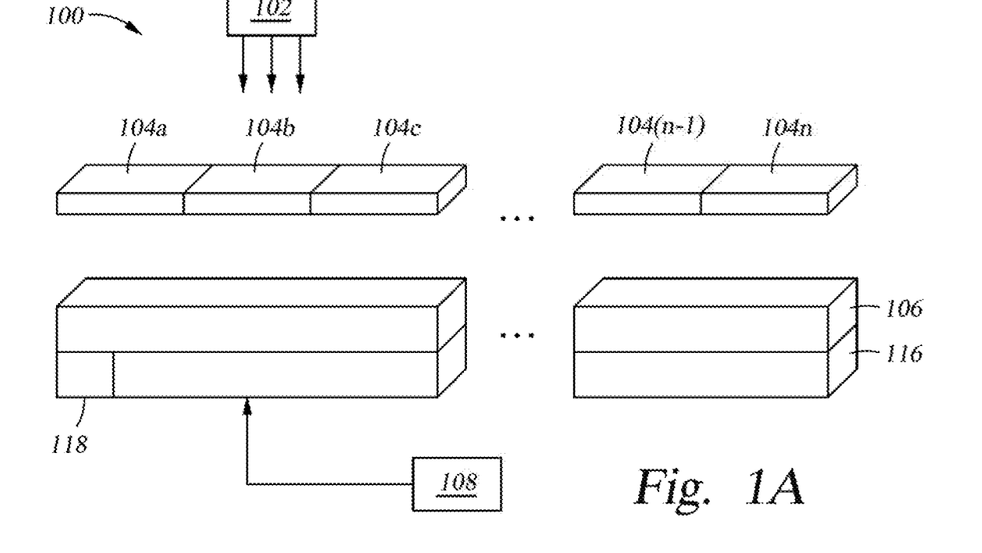
FIG. 1A is a schematic view of a lithography system according to an embodiment.
Figure 1B:
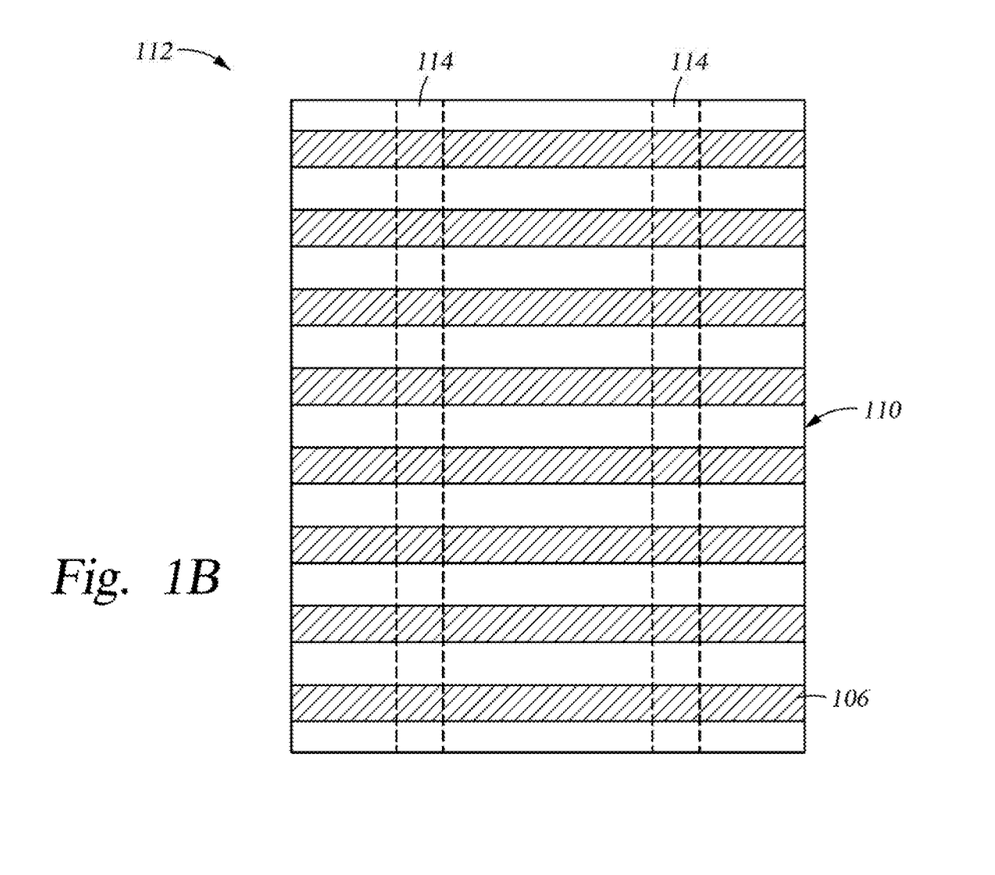
FIG. 1B is a schematic plan view of a substrate exposed to a lithography process.

FIG. 1A is a schematic view of a lithography system 100. FIG. 1B is a schematic, plan view of a substrate 106 exposed to a lithography process. It is to be understood that the lithography system 100 is an exemplary system and other systems, including systems from other manufacturers, may be used with or modified to accomplish aspects of the present disclosure. The system includes a projection unit 102 that includes one or more light sources, such as a light emitting diodes (LEDs) or lasers, capable of projecting write beams in the direction of two or more masks 104a, 104b, 104c, ... 104(n–1), 104n (collectively referred to as the "the two or more masks 104"). The masks are disposed over the substrate 106. The two or more masks 104 can have mask patterns 405a, 405b, 405c, ... 405(n–1), 405n (collectively referred to as the "mask patterns 405" shown in FIGS. 4A and 4B).

The substrate 106 comprises any suitable material, for example, glass, which is used as part of a flat panel display. In some embodiments, which can be combined with other embodiments described herein, the substrate 106 is made of other materials capable of being used as a part of the flat panel display. In other embodiments, which can be combined with other embodiments described herein, the substrate can have surface width of from about 5 mm to about 70 mm, such as from about 5 mm to about 100 mm, such as from about 5 mm to about 20 mm, alternatively from about 50 mm to 60 mm. In some embodiments, which can be combined with other embodiments described herein, the substrate can have surface length of from about 5 mm to about 100 mm, such as from about 5 mm to about 60 mm, such as from about 5 mm to about 20 mm, alternatively from about 50 mm to 60 mm. For example, the substrate can have dimensions of from about 30 mm to about 60 mm by from about 25 mm to about 60 mm. The substrate 106 has a film layer to be patterned formed thereon, such as by pattern etching thereof, and a photoresist layer 110 formed on the film layer to be patterned, which is sensitive to electromagnetic radiation, for example, ultraviolet (UV), extreme ultraviolet (EUV) or deep UV "light". A positive tone photoresist includes portions of the photoresist layer 110, when exposed to radiation, are respectively soluble to a photoresist developer applied to the photoresist layer 110 after the pattern is written into the photoresist layer 110 using the electromagnetic radiation. A negative tone photoresist includes portions of the photoresist layer 110, when exposed to radiation, will be respectively insoluble to photoresist developer applied to the photoresist layer 110 after the pattern is written into the photoresist layer 110 using the electromagnetic radiation. A negative tone development includes the positive tone photoresist layer 110 exposed by bright field mask, where the exposed region will be respectively insoluble in organic solvent (e.g. n-butanol) and remain on the wafer post development. The chemical composition of the photoresist layer 110 determines whether the photoresist layer 110 is a positive photoresist or negative photoresist.

During operation, the projection unit 102 projects write beams in the direction of one or more of the masks 104. The mask patterns 405 of the two or more masks 104, positioned according to embodiments of a method 300 described herein, correspond to a device pattern 112 to be written into a photoresist layer 110, when the write beams are projected in the direction of one or more of the masks 104. Device portions 114 of the device pattern 112 written into a photoresist layer 110 correspond to stitched portions 403a, 403b, ... 403(n–1) (collectively referred to as the "stitched portions 403" shown in FIGS. 4B and 4C) of the mask patterns 405. The feature extensions 407 of the mask patterns 405 of interfacing masks of the two or more masks 104 (shown in FIGS. 4A and 4B) are modeled and positioned to be stitched together. In order to achieve pattern stitching, the mask patterns 405 of different masks are obtained by separate exposure and overlapped with each other. In an example lithography exposure process, the first mask 104a is loaded followed by exposure forming the first mask pattern 405a which is written into the photoresist layer 110; then the second mask 104b is loaded followed by exposure forming the second mask pattern 405b, and the first and second feature extension patterns are overlapped resulting in a stitched mask pattern 405. The feature extensions 407 of interfacing masks of the two or more masks 104 are modeled and positioned (i.e., overlapped) such that the device pattern 112 is substantially seamless at the device portions 114. In some embodiments, which can be combined with other embodiments described herein, the feature extensions 407 of interfacing masks of the two or more masks 104 are modeled and positioned such that that the device pattern 112 is seamless at the device portions 114 written into a photoresist layer 110. In some embodiments, which can be combined with other embodiments described herein, the device pattern 112 may correspond to a device to be patterned into the substrate 106 or a film layer disposed on the substrate 106. In other embodiments, which can be combined with other embodiments described herein, the device pattern 112 may correspond to one or more devices to be patterned into the substrate 106 or a film layer disposed on the substrate 106.

In some embodiments, which can be combined with other embodiments described herein, the lithography system 100 is sized to be capable of exposing the entire photoresist layer on the substrate 106. In other embodiments, which can be combined with other embodiments described herein, substrate 106 can be supported by a stage 116 operable to positon the substrate 106 in a predetermined path beneath one or more of the masks 104. The movement of the substrate may be controlled by a controller 108. The controller 108 is generally designed to facilitate the control and automation of a lithography process based on a mask pattern file. The mask pattern file (e.g., the mask pattern file 400 shown in FIGS. 4A and 4B) includes mask pattern data having instructions for the positioning of the two or more masks 104 according to embodiments of the method 300 described herein. The controller 108 may be coupled to or in communication with at least the projection unit 102, the stage 116, and an encoder 118. The projection unit 102 and the encoder 118 may provide information to the controller 108 regarding the substrate processing and the substrate aligning. For example, the projection unit 102 may provide information to the controller 108 to alert the controller 108 that substrate processing has been completed.

Figure 2:
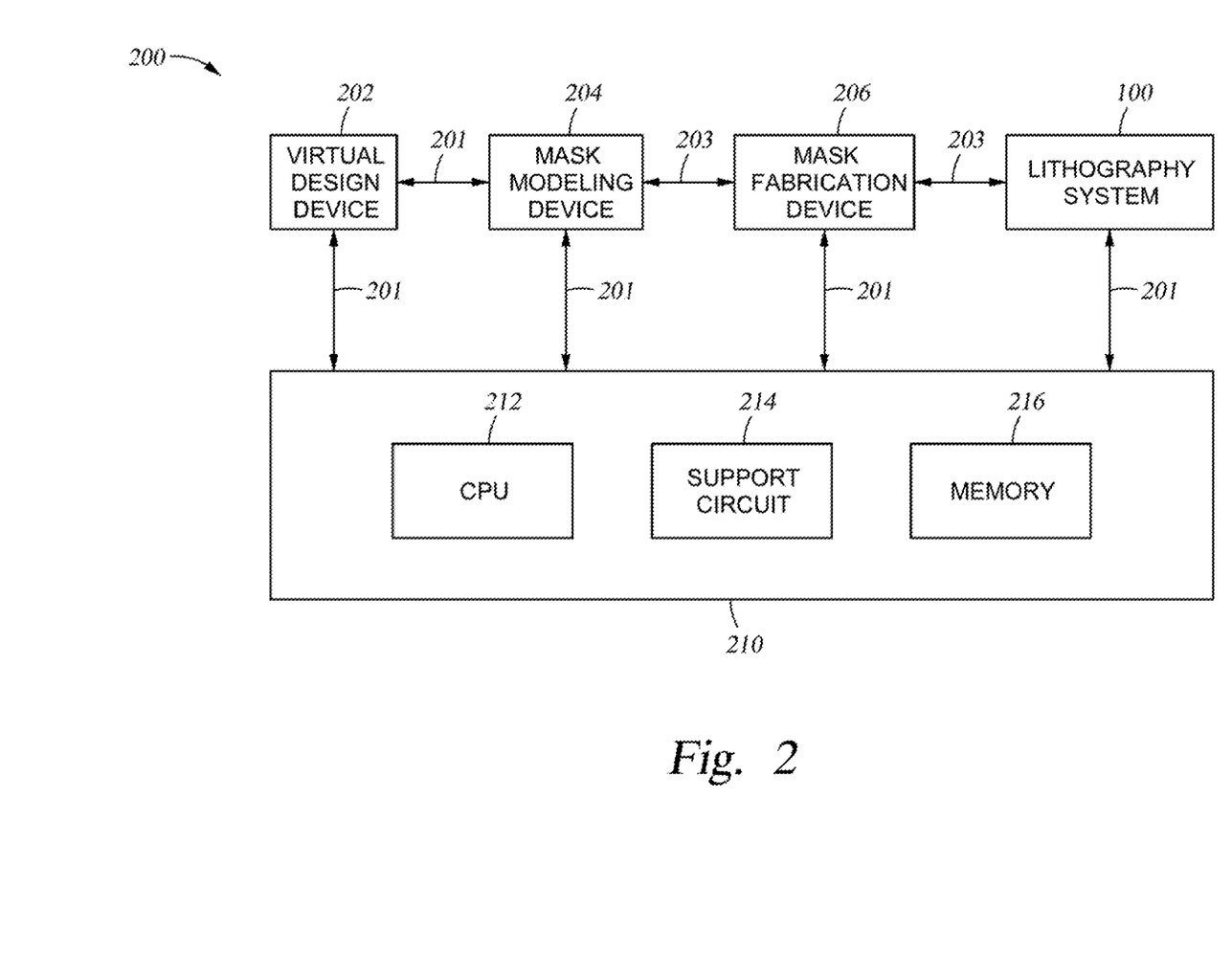
FIG. 2 is a schematic diagram of a lithography environment according an embodiment.

FIG. 2 is a schematic diagram of a lithography environment 200. As shown in FIG. 2, the lithography environment 200 includes, but is not limited to, a virtual design device 202, a mask modeling device 204, a mask fabrication device 206, the lithography system 100, a controller 210, and a plurality of communication links 201, and a transfer system 203. Each of lithography environment devices is operable to be connected to the controller 210 by the communication links 201. Alternatively or additionally, each of the lithography environment devices can communicate indirectly by first communicating with the controller 210, followed by the controller communicating with the lithography environment device in question. Each of the lithography environment devices of the lithography environment 200 can be located in the same area or production facility, or the each of the lithography environment devices can be located in different areas.

The virtual design device 202 is operable to at least one of create, optimize, verify, and update a design file. The design file corresponds to a device pattern 112 to be written into the photoresist layer 110. The mask modeling device 204 is operable to divide the design file and generate a mask pattern file 400 according to method 300 operations described herein. The mask pattern file 400 includes mask pattern data for the two or more masks 104 according to method 300 operations described herein. The mask fabrication device 206 is operable to receive to mask pattern data for the two or more masks 104 transmitted from the mask modeling device 204. According to method 300 operations described herein, the mask fabrication device 206 is operable to fabricate the mask patterns 405 of the two or more masks 104 that correspond to the device pattern 112 to be written into a photoresist layer 110 when the two or more masks 104 are positioned according to embodiments described herein. The lithography system 100 is operable to receive the two or more masks 104 according to method 300 operations described herein.

Each of the plurality of lithography environment devices are additionally indexed with method 300 operations described herein. Each of the virtual design device 202, the mask modeling device 204, the mask fabrication device 206, the lithography system 100, and controller 210 include an on-board processor and memory, where the memory is configured to store instructions corresponding to any portion of the method 300 described below. The communication links 201 may include at least one of wired connections, wireless connections, satellite connections, and the like. The communications links 201 include sending and receiving a universal metrology file (UMF) or any other file used to store data, according to embodiments further described herein. The communications links 201 can include temporarily or permanently storing files or data in the cloud, before transferring or copying the files or data to a lithography system tool. The mask fabrication device 206 and the mask modeling device 204 are connected by the transfer system 203. The transfer system 203 is operable to transfer a substrate between the mask fabrication device 206 and the lithography system 100. In one embodiment, which can be combined with other embodiments described herein, the transfer system 203 can include robots or other equipment connectable to the controller 210 operable to transfer the one or more masks 104. In one embodiment, which can be combined with other embodiments described herein, the transfer system 203 is physically operable by the user.

The controller 210 includes a central processing unit (CPU) 212, support circuits 214 and memory 216. The CPU 212 can be one of any form of computer processor that can be used in an industrial setting for controlling the lithography environment devices. The memory 216 is coupled to the CPU 212. The memory 216 can be one or more of readily available memory, such as random access memory (RAM), read only memory (ROM), floppy disk, hard disk, or any other form of digital storage, local or remote. The support circuits 214 are coupled to the CPU 212 for supporting the processor in a conventional manner. These circuits include cache, power supplies, clock circuits, input/output circuitry, subsystems, and the like. The controller 210 can include the CPU 212 that is coupled to input/output (I/O) devices found in the support circuits 214 and the memory 216.

The memory 216 can include one or more software applications, such as a controlling software program. The memory 216 can also include stored media data that is used by the CPU 212 to perform the method 300 described herein. The CPU 212 can be a hardware unit or combination of hardware units capable of executing software applications and processing data. The CPU 212 is generally configured to execute the one or more software applications and process the stored media data, which can be each included within the memory 216. The controller 210 controls the transfer of data and files to and from the various lithography environment devices. The memory 216 is configured to store instructions corresponding to any operation of the method 300 according to embodiments described herein.

Figure 3:
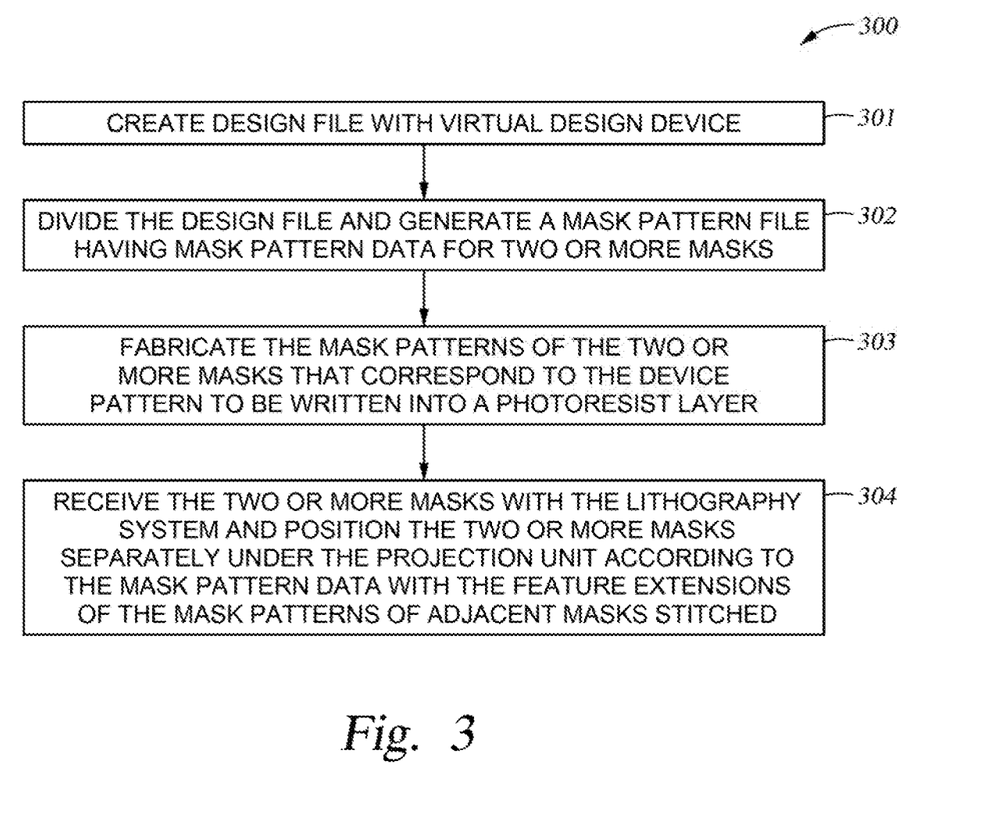
FIG. 3 is a flow diagram of a lithography process according to an embodiment.

FIG. 3 is a flow diagram of method 300 of a lithography process. At optional operation 301, a design file is created by the virtual design device 202. The design file corresponds to the device pattern 112 to be written into a photoresist layer 110. In some embodiments, which can be combined with other embodiments described herein, the design file is created prior to operations of the method 300 described herein. At operation 302, the mask modeling device 204 divides the design file and generates a mask pattern file 400 having mask pattern data for two or more masks 104 (as shown and described in FIGS. 4A, 4B, 4D, and 4E).

At operation 303, the mask fabrication device 206 fabricates the mask patterns 405 of the two or more masks 104 that correspond to the device pattern 112 to be written into a photoresist layer 110 when the two or more masks 104 are positioned according to embodiments described herein. At operation 304, the two or more masks 104 are received by the lithography system 100 and positioned separately under the projection unit 102 according to the mask pattern data with the feature extensions 407 of the mask patterns 405 of adjacent masks 104 stitched together. The feature extensions 407 of the mask patterns 405 of adjacent masks of the two or more masks 104 (shown in FIGS. 4A and 4B) are modeled and positioned to be stitched together. In order to achieve pattern stitching, the mask patterns 405 of different masks are obtained by separate exposure and overlapped with each other. In an example lithography exposure process, the first mask 104a is loaded followed by exposure forming the first mask pattern 405a which is written into the photoresist layer 110; then the second mask 104b is loaded followed by exposure forming the second mask pattern 405b, and the first and second feature extension patterns are overlapped resulting in a stitched mask pattern 405.

Figure 4A:
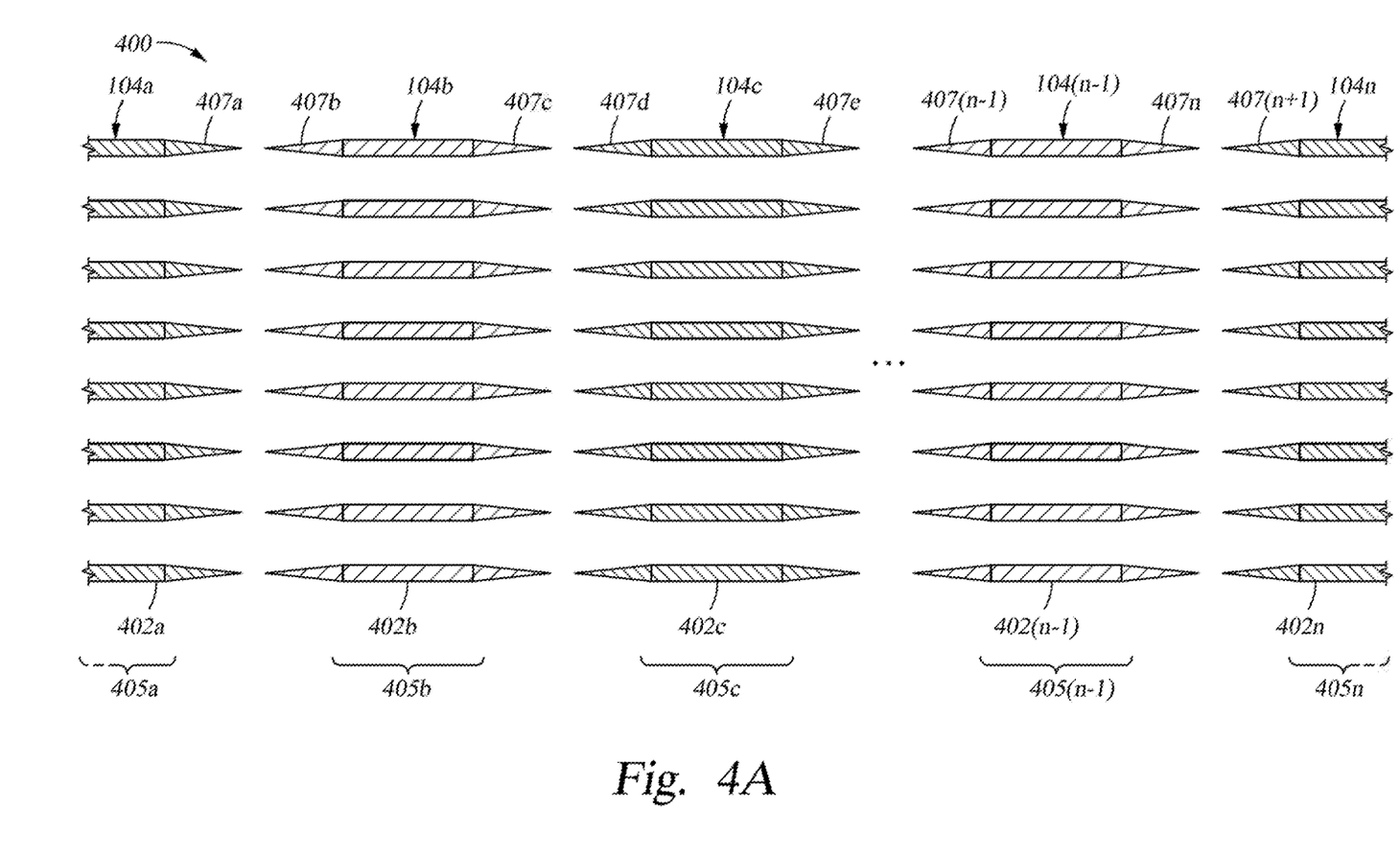
FIGS. 4A and 4B are illustrative views of a mask pattern file according to an embodiment.
Figure 4B:
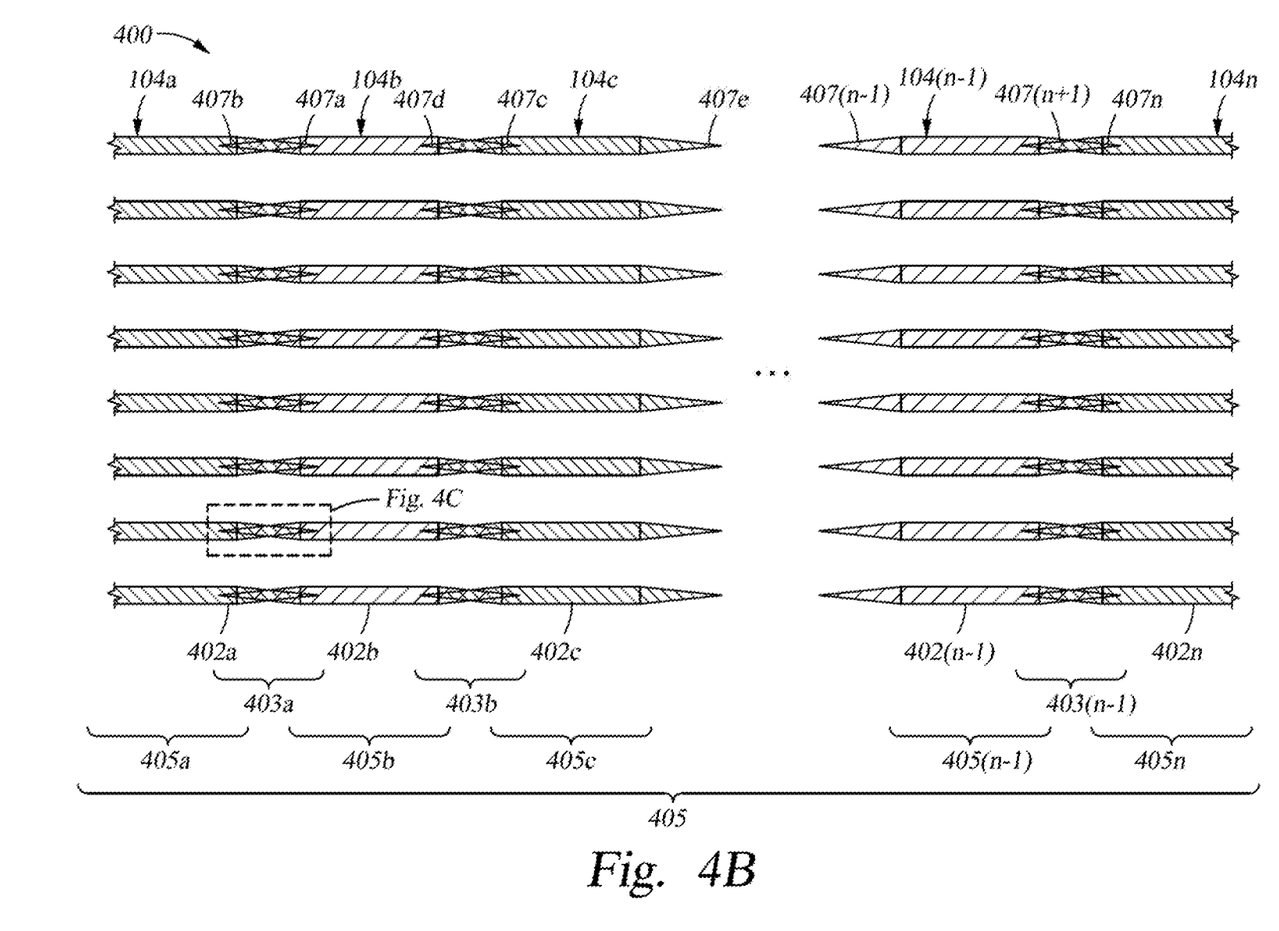

FIGS. 4A and 4B are illustrative views of a mask pattern file 400. As shown in FIG. 4A, the feature extensions 407 of the mask patterns 405 of interfacing masks of the two or more masks 104 are not stitched. As shown in FIG. 4B, the feature extensions 407a, 407b, 407c, 407d, 407e . . . 407(n−1), 407n, 407(n+1) (collectively referred to as the "feature extensions 407" shown in FIGS. 4A and 4B) of the mask patterns 405 of interfacing masks of the two or more masks 104 are stitched according to the mask pattern data of the mask pattern file 400 as described at operation 304. The mask pattern file 400 includes two or more masks 104 having features 402a, 402b, 402c, . . . 402(n-1), 402n (collectively referred to as the "features 402" shown in FIGS. 4A and 4B) of the mask patterns 405. The stitched portions 403 include features extensions 407 of features 402 that are to be stitched. For example, stitched portion 403a is the stitching between features 402a and 402b.

For example, as shown in FIGS. 4A and 4B, a first pair of masks including a first mask 104a and a second mask 104b is shown. The first mask 104a with a first set of features having first feature extensions 407a extending from a first feature interface 406a to an opposing end 408a of the first feature extensions. The second mask 104b with a second set of features having second feature extensions 407b extending from a second feature interface 406b to an opposing end 408b of the second feature extensions. The first feature extensions 407a stitches with each corresponding second feature extensions 407b at a first stitched portion 403a of the first pair of mask patterns (e.g., 405a and 405b). As shown in FIGS. 4A and 4B, a second pair of masks is shown including the second mask 104b and a third mask 104c. The second mask stitches with the third mask to form a second stitched portion 403b of the second pair of masks. In some embodiments, which can be combined with other embodiments described herein, a single mask can be stitched with one or more additional masks in accordance with some embodiments of the present disclosure. As shown in FIGS. 4A and 4B, the nth mask 104n can be stitched with an adjacent (n-1)th mask 104(n-1) at a stitched portion 403(n-1). The feature extensions 407 of the interfacing portions are modeled and stitched as described and shown in FIG. 4C.

Figure 4C:
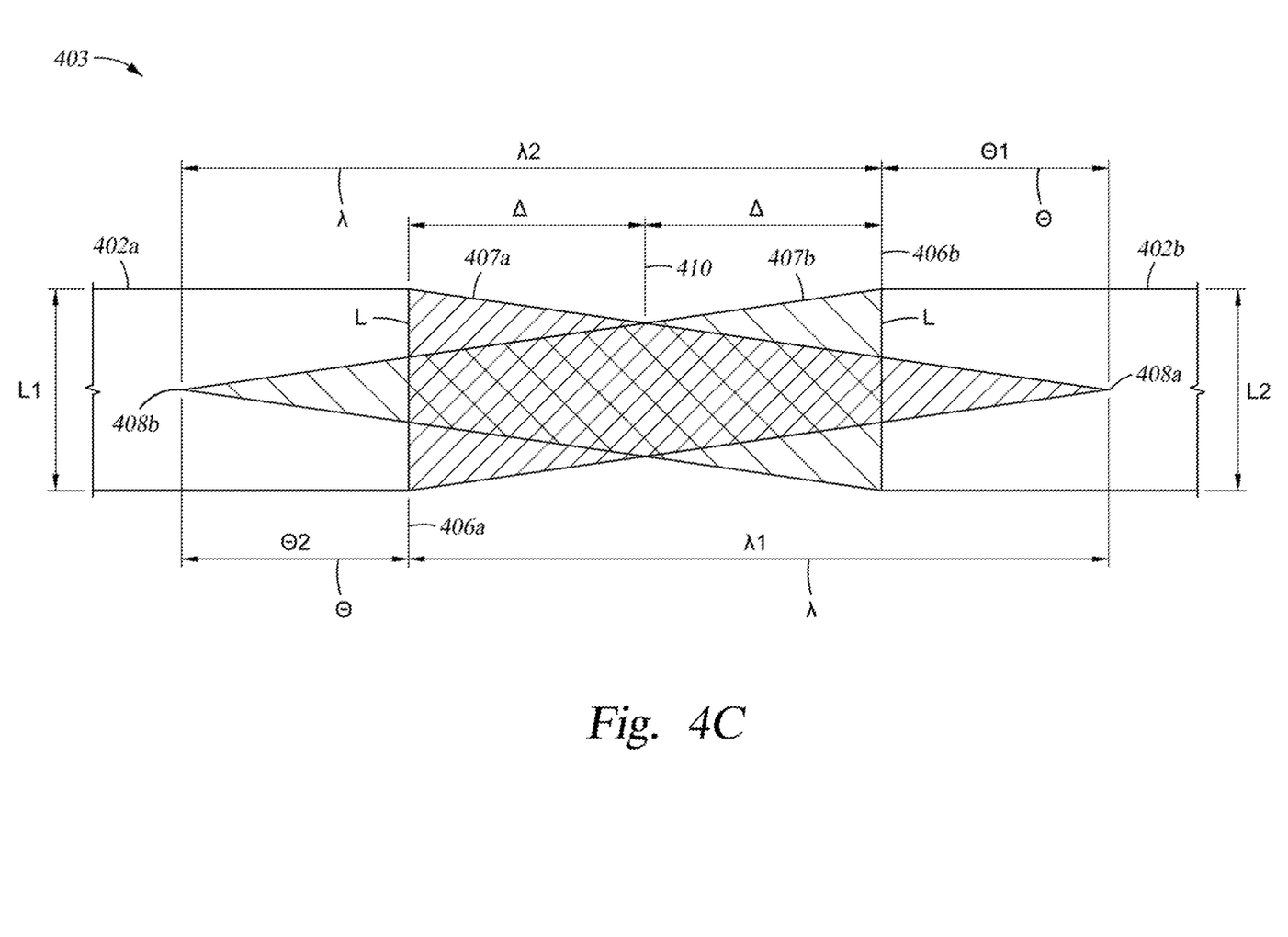
FIG. 4C is an illustrative view of a stitched portion according to an embodiment.

FIG. 4C is an illustrative view of a stitched portion 403. As shown in FIG. 4C, several parameters can be used to model a mask pattern design for each stitched portion 403 for each pair of overlapping mask patterns (e.g., 405a and 405b, 405b and 405c, . . . 405(n-1) and 405n). In one example, a first pair of overlapping mask patterns (e.g., 405a and 405b) is provided having a first mask pattern 405a and a second mask pattern 405b which overlap at a stitched portion 403. Each of the parameters described herein is described with reference to a first feature 402a and a second feature 402b of a first pair of stitched masks of the stitched portion 403.

A first feature width L1 of the stitched portion 403 represents a width at the first feature interface 406a between a first feature 402a of the mask pattern 405 and a first feature extension 407a. A second feature width L2 represents a width at the second feature interface 406b between a second feature 402b of the mask pattern 405 and a second feature extension 407b. Feature widths L1 and L2, as used herein, can be collectively represented as "L". The stitched portion 403 further provides a first feature end location θ1 which is a distance from a second feature interface 406b to an opposing end 408a of a corresponding first feature extension 407a in a stitched portion 403. A second feature end location θ2 is a distance from a first feature interface 406a to an opposing end 408b of a corresponding second feature extension 407b in a stitched portion 403. Feature end locations θ1 and θ2, as used herein, can be collectively represented as "θ". A stitching shift Δ, is half the distance from the first feature interface 406a to the corresponding second feature interface 406b of a stitched portion 403. A first feature extension length (λ1) is a length of each first feature extension 407a. For example, λ1 is a distance from the first feature interface 406a to the opposing end 408a of a stitched portion 403. A second feature extension length λ2 is a length of each second feature extension 407b. For example, λ2 is a distance from the first feature interface 406a to the opposing end 408a of a stitched portion 403.

In one example, when θ1 and θ2 are equal to zero, then λ1=λ2=Δ+Δ. In some embodiments, which can be combined with other embodiments described herein, θ has a negative value. For example, θ1 is negative when the opposing end 408a of a first feature extension 407a is positioned to overlap with a second feature extension 407b, but does not overlap the second feature interface 406b. In some embodiments, which can be combined with other embodiments described herein, θ has a positive value. For example, θ1 can be positive when the opposing end 408a of a first feature extension 407a overlaps a second feature extension 407b and overlaps the second feature interface 406b. In some embodiments, which can be combined with other embodiments, the mask modeling device 204 generates a model of stitched portions 403 of the two or more mask patterns 405 using θ1=f(L1, λ1, Δ) or Δ=f(L1, λ1, θ), the stitched portions 403 including first features 402a having first feature extensions 407a extending therefrom at first feature interfaces 406a and corresponding second features 402b having second feature extensions 407b extending therefrom at second feature interfaces 406b.

Each of the parameters measured with respect to the second features 402b do not necessarily have the same values as the measurements for the first features 402a. In some embodiments, which can be combined with other embodiments described herein, each first feature interface 406a of the first plurality of feature interfaces comprises a first feature width (L1), and each second feature interface 406b of the second plurality of feature interfaces comprises a second feature width (L2). In some embodiments, which can be combined with other embodiments described herein, L1 is substantially equal to L2, alternatively L1 is not equal to L2. Similarly, each of the parameters λ and θ can be the same or different between the first feature 402a and the second feature 402b in the stitched portion 403. Additionally, each mask can have uniform stitched portions 403, or the stitched portions 403 can be different at different portions of each of the mask patterns 405.

In some embodiments, which can be combined with other embodiments described herein, θ can be determined based on one or more of λ, Δ, L, and combinations thereof. For example, one or more equations, such as θ=f(L, λ, Δ), Δ=f(L, λ, θ), θ1=f(L1, λ1, Δ), θ2=f(L2, λ2, Δ), Δ=f(L1, λ1, θ1), Δ=f(L2, λ2, θ2), Δ=f(L1, λ1, θ1)=f(L2, λ2, θ2), or combinations thereof can be modeled or solved for one or more of the parameters, such as θ, Δ, θ1, θ2, λ1, λ2, or combinations thereof. In some embodiments, which can be combined with other embodiments described herein, the feature width (L) at a feature interface (e.g. 406a, 406b) is greater than an opposing end width of the corresponding feature extension (e.g. 408a, 408b).

Figure 4D:
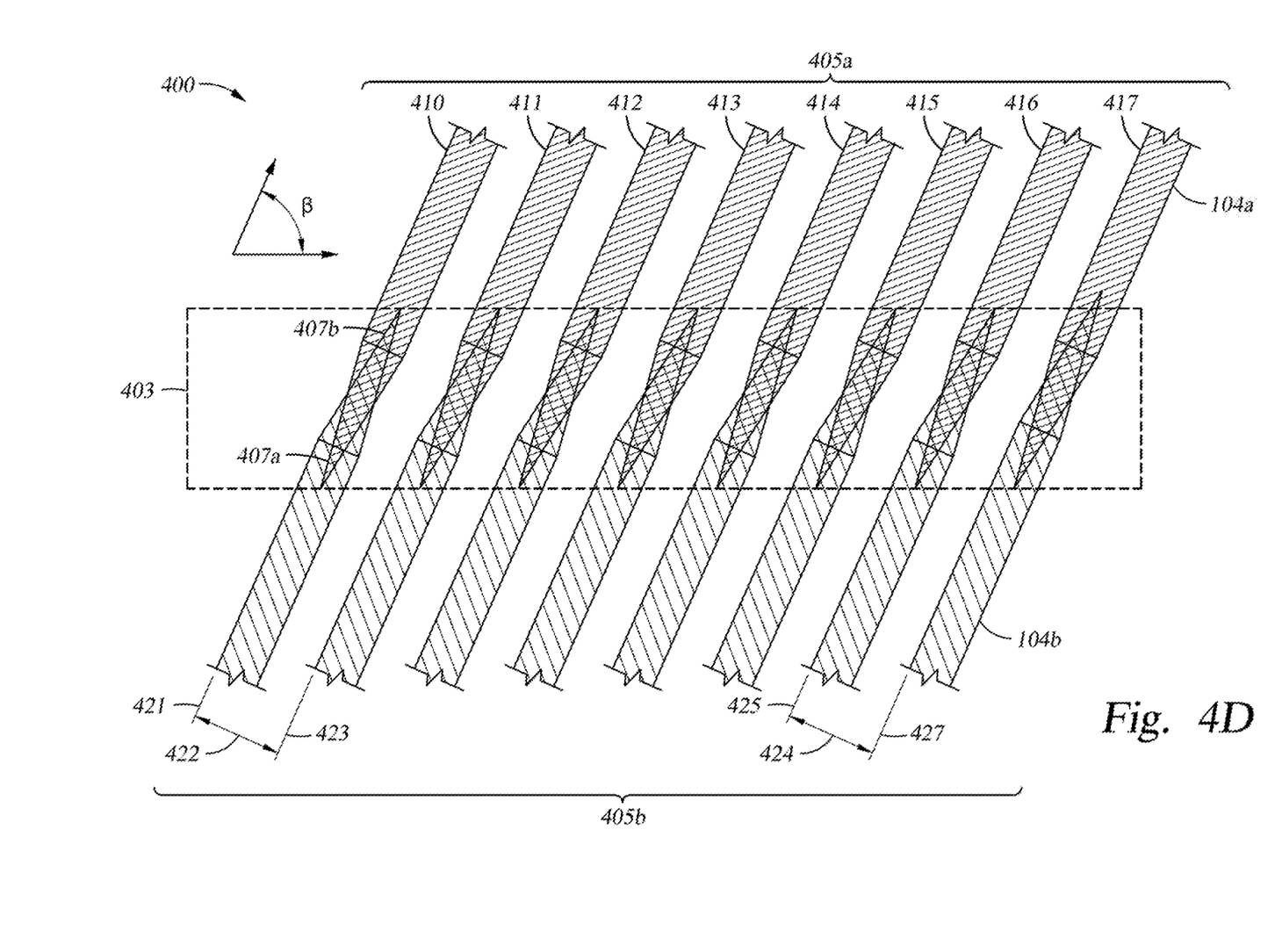
FIGS. 4D and 4E are illustrative views of mask pattern files according to an embodiment.
Figure 4E:
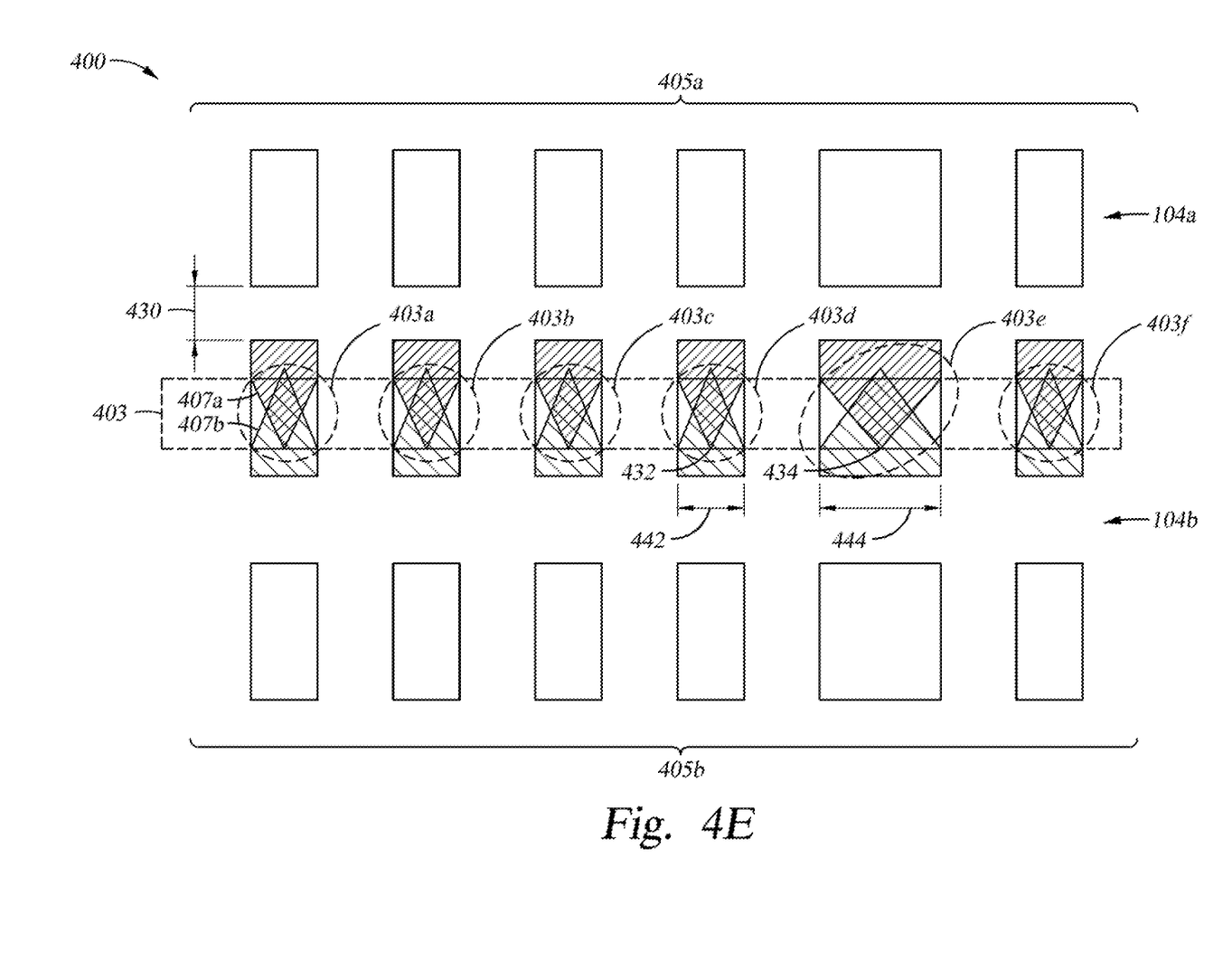

FIGS. 4D and 4E are illustrative views of mask pattern files 400. FIG. 4D depicts a pitch 422 and a pitch 424. Pitch 422 is measured from the first leading edge 421 of feature 410 and the first leading edge 423 of the feature 411. Similarly, pitch 424 is measured from the first leading edge 425 of feature 416 and the first leading edge 427 of the feature 417. In some embodiments, which can be combined with other embodiments described herein, a model can be generated to determine θ and/or Δ based on a pitch (e.g. 422, 424) between adjacent features of each of the mask patterns 405. As used herein, the "pitch" is a distance between first leading edges of adjacent features. In some embodiments, which can be combined with other embodiments described herein, a mask pattern (e.g. 405b) can have a uniform pitch (e.g. 422) between features (e.g. 410 and 411). In some embodiments, which can be combined with other embodiments described herein, a mask pattern (e.g. 405b) can have different pitches as shown by pitch 422 and 424 in FIG. 4D.

In some embodiments, which can be combined with other embodiments described herein, the mask pattern file 400 that can be created with methods and systems of the present disclosure can also include features that are angled as shown in FIG. 4D. As can be seen, the mask pattern file 400 depicted in FIG. 4D includes a first mask 104a and a second mask 104b that stitches with the first mask 104a at stitched portions 403. Moreover, the features (e.g. 410, 411, 412, 413, 414, 415, 416, and 417) can vary in angles β and vary in pitch (e.g. 422, 424) between the features (e.g. 410-417). For example, the features (e.g. 410-417) can be angled β at about 0 degrees, or about 30 degrees, or about 90 degrees, or about 120 degrees, or about 150 degrees.

FIG. 4E further illustrates another example mask pattern file 400 with a first mask 104a and a second mask 104b which include stitched portions 403. The mask pattern file 400 in FIG. 4E shows discontinuous features (e.g. 430) rather than continuous features. In some embodiments, which can be combined with other embodiments described herein, the features (e.g. 410-417) are line features as depicted in FIG. 4D. As can be seen, a number of different mask patterns 405 are possible for the stitching methods 300 and lithography systems 100 of the present disclosure. In some embodiments, which can be combined with other embodiments described herein, the stitched portions 403 between adjacent mask patterns (e.g. 405a and 405b) are seamless. In some embodiments, which can be combined with other embodiments described herein, Δ is less than λ, such as less than half of λ. In some embodiments, which can be combined with other embodiments described herein, Δ is less than L, such as less than 25% less than L. With respect to the feature width (L), a mask pattern (e.g. 405a) can have uniform feature width at a feature interface (e.g. 406a) of stitched portions (e.g. 403a, 403b, 403c, 403d, 403f) or a mask pattern (e.g. 405a) can have different feature widths (e.g. 432 and 434) at feature interfaces (e.g. 442 and 444) at stitched portions (e.g. 403d, 403e), as shown in FIG. 4E.

Figure 4F:
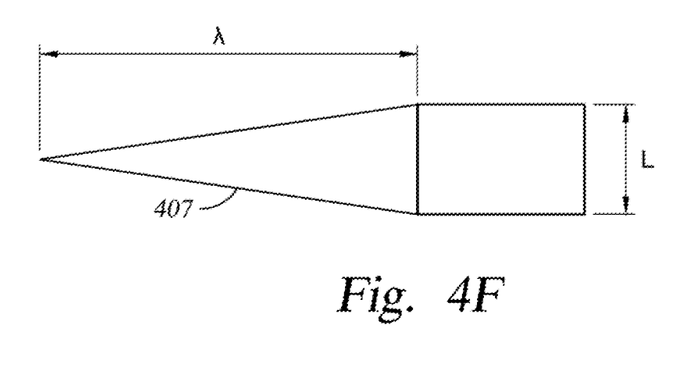
FIGS. 4F-4I are illustrative views of feature extensions according to embodiments.
Figure 4G:
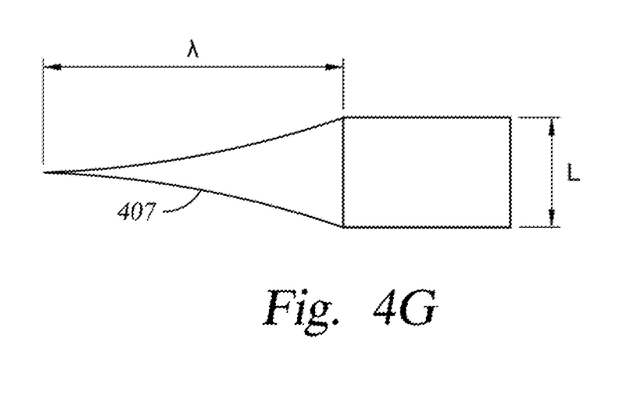
Figure 4H:
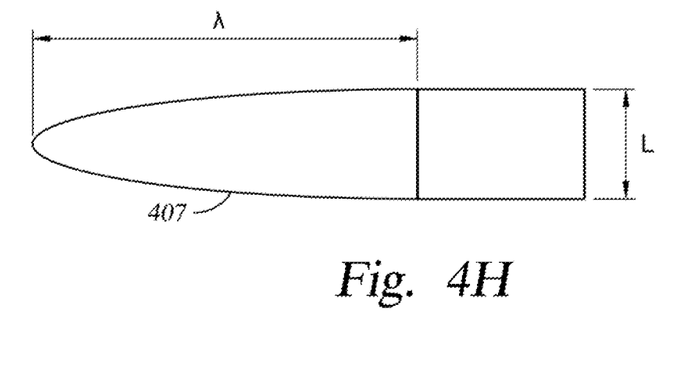
Figure 4I:
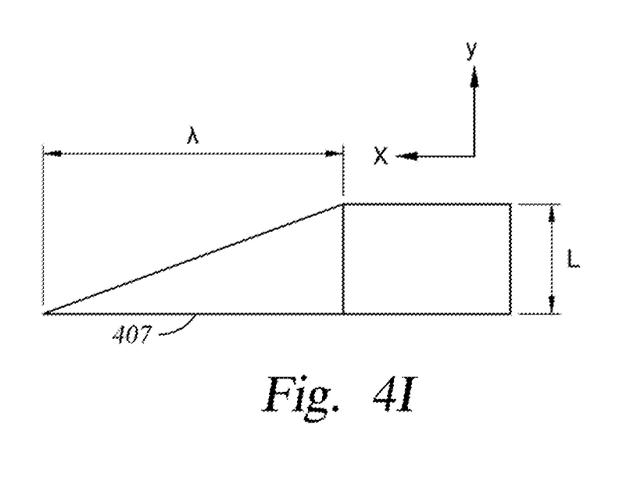

Additionally, the feature extension shape can also vary in shape depending on one or more of λ, θ, L, Δ, and pitch (e.g. 422, 424). FIGS. 4F-4I are illustrative views of example feature extensions 407 having a variety of shapes. In particular, FIG. 4F depicts a feature extension 407 having a triangular shape, FIG. 4G depicts a feature extension 407 having a concave shape, FIG. 4H depicts a feature extension 407 having a convex shape, and FIG. 4I depicts a feature extension 407 with a right angle shape. For example, referring to FIG. 4F, a constant Δ and λ is used as a nominal condition. If the stitching requires more overlapping area, the feature extension 407 shape in FIG. 4G will be used. Alternatively, if the stitching requires less overlapping area, the feature extension 407 shape in FIG. 4H will be used. As can be seen in FIG. 4I, the feature extension 407 shape can also be asymmetrical about the axis (e.g. axis x) perpendicular to the line interface axis (e.g. axis y). For example, the feature extension 407 shape can be right triangle.

In summation, a method of a lithography process is provided that stitches two or more masks enabling transfer of mask patterns to large substrates with seamless transfers at the stitched portions of the two or more masks. Some embodiments of the method includes positioning two or more masks in a propagation direction of a light source. The masks correspond to a pattern to be written into a photoresist layer of a substrate disposed under the masks. Positioning the masks includes stitching a pair of masks. The first mask in the pair includes a set of first features having first feature extensions extending therefrom at first feature interfaces and the second mask includes a set of second features having second feature extensions extending therefrom at second feature interfaces. Each first feature extension stitches with each corresponding second feature extension to form each stitched portion of a first stitched portion of the first pair of masks, the stitched portion of the first pair of masks defining a portion of the pattern to be written into the photoresist layer.

While the foregoing is directed to embodiments of the present disclosure, other and further embodiments of the disclosure may be devised without departing from the basic scope thereof, and the scope thereof is determined by the claims that follow.

The invention claimed is:

1. A method, comprising:
   positioning two or more masks in a propagation direction of a light source, the masks corresponding to a pattern to be written into a photoresist layer of a substrate disposed under the masks, the positioning masks comprising:
   determining a first feature end location (θ1) of a first mask of a first pair of masks, the first pair of masks comprising the first mask and a second mask, wherein:
      the first mask comprises a set of first features having first feature extensions extending therefrom at first feature interfaces;
      the second mask comprises a set of second features having second feature extensions extending therefrom at second feature interfaces; and
   stitching the first pair of masks, wherein each first feature extension stitches with each corresponding second feature extension to form each stitched portion of a first stitched portion of the first pair of masks, the stitched portion of the first pair of masks defining a portion of the pattern to be written into the photoresist layer, wherein θ1 comprises a distance from each second feature interface to an opposing end of each corresponding first feature extension in the first stitched portion, and wherein θ1 is determined based on at least one of:
      a pitch between adjacent features of the first mask, wherein the pitch is a distance between first leading edges of each adjacent feature;
      a stitching shift (Δ) comprising substantially half a distance from each first feature interface to each corresponding second feature interface of the stitched portion;
      a first feature width (L1) comprising a width at each of the first feature interfaces of each stitched portion; or
      a first feature extension length (λ1) comprising a length of each first feature extension.

2. The method of claim 1, wherein determining each θ1 is based on:
   the first feature width (L1); and
   the stitching shift (Δ).

3. The method of claim 1, wherein determining θ1 is based on:
   the first feature width (L1); and
   the first feature extension length (λ1).

4. The method of claim 1, further comprising determining θ1 based on the pitch between adjacent features of the first mask.

5. The method of claim 1,
wherein each first feature interface comprises a first feature width (L1), each L1 greater than a width at each corresponding opposing end of the first feature extension; and
wherein each second feature interface comprises a second feature width (L2) comprising a width of each second feature interface, each L2 greater than a width at each corresponding opposing end of the second feature extension.

6. The method of claim 5, wherein L1 is substantially equal to L2.

7. The method of claim 5, wherein L1 is not equal to L2.

8. The method of claim 1, further comprising determining a first feature extension shape based on the first feature end location (θ1).

9. The method of claim 8, wherein the first feature extension shape has one a triangular shape, convex shape, and concave shape.

10. The method of claim 1, further comprising determining dimensions of the stitched portion by solving θ1=f(L1, λ1, Δ) or Δ=f(L1, λ1, θ1).

11. The method of claim 1, further comprising stitching the first mask with a third mask to form a second stitched portion, the second stitched portion comprising a second portion of the pattern to be written into the photoresist layer.

12. The method of claim 1, further comprising forming the masks comprising:
creating a design file, the design file having the pattern to be written into the photoresist layer;
dividing the design file between two or more mask patterns; and
generating a plurality of features for each of the mask patterns, wherein:
stitching features of each of the mask patterns includes stitching first feature extensions that are to be stitched with second feature extensions of adjacent mask patterns; and
the first feature extensions to be stitched with the second feature extensions comprise portions of the pattern to be written into the photoresist layer at the stitching of the masks formed from the mask patterns.

13. A non-transitory computer readable medium storing instructions that when executed by a processor, cause a computer system to:
create a design file, the design file having a pattern to be written into a photoresist layer;
divide the design file between a plurality of mask patterns;
generate a plurality of features for each of the mask patterns, wherein:
overlapping features of each of the mask patterns include first feature extensions extending at first feature interfaces that are to be stitched with second feature extensions extending at second feature interfaces of adjacent mask patterns; and
each of the first feature extensions to be stitched with each of the second feature extensions comprises each stitched portion of the pattern to be written into the photoresist layer at a stitching of masks formed from the mask patterns; and
determine a first feature end location (θ1) comprising a distance from each second feature interface to an opposing end of each corresponding first feature extension of each stitched portion, wherein the first feature end location θ1 is determined based on at least one of:
a pitch between adjacent features of each mask pattern, wherein the pitch comprises a distance between first leading edges of each adjacent feature;
a stitching shift (Δ) comprising substantially half a distance from each first feature interface to each corresponding second feature interface of the stitched portion;
a first feature width (L1) comprising a width at each of the first feature interfaces of each stitched portion; or
a first feature extension length (λ1) comprising a length of each first feature extension.

14. The non-transitory computer-readable medium of claim 13, wherein the instructions further cause the computer system to determine dimensions of each stitched portion by solving one of θ1=f(L1, λ1, Δ), Δ=f(L1, λ1, θ1), θ2=f(L2, λ2, Δ), or Δ=f(L2, λ2, θ2) wherein:
a second feature end location (θ2) comprises a distance from each first feature interface to an opposing end of each corresponding second feature extension in each stitched portion;
a second feature width (L2) comprises a second feature width at each of the second feature interfaces of each stitched portion; and
a second feature extension length (λ2) comprises a length of each second feature extension.

15. The non-transitory computer-readable medium of claim 14, wherein the instructions further cause the computer to determine a first feature extension shape based on one or more of θ1, L1, λ1, and Δ.

16. The non-transitory computer-readable medium of claim 14, wherein the first feature end location θ1 is determined based on the stitching shift (Δ).

17. The non-transitory computer-readable medium of claim 13,
wherein the first feature end location θ1 is determined based on the pitch between adjacent features of a mask pattern.

18. A non-transitory computer readable medium storing instructions that when executed by a processor, cause a computer system to:
divide a design file between two or more mask patterns; and
generate a model of stitched portions of the two or more mask patterns using one of θ1=f(L1, λ1, Δ), Δ=f(L1, λ1, θ1), θ2=f(L2, λ2, Δ), or Δ=f(L2, λ2, θ2) wherein:
the stitched portions comprises first features having first feature extensions extending therefrom at first feature interfaces and corresponding second features having second feature extensions extending therefrom at second feature interfaces;
a first feature end location (θ1) comprises a distance from each second feature interface to an opposing end of each corresponding first feature extension in each stitched portion;
a stitching shift (Δ) comprises substantially half a distance from each first feature interface to each corresponding second feature interface of each stitched portion;
a first feature width (L1) comprises a width at each of the first feature interfaces of each stitched portion;
a first feature extension length (λ1) comprises a length of each first feature extension;
a second feature end location (θ2) comprises a distance from each first feature interface to an opposing end of each corresponding second feature extension in each stitched portion;

wherein a second feature width (L2) comprises a width at each of the second feature interfaces of each stitched portion; and
a second feature extension length (λ2) comprises a length of each second feature extension.

* * * * *